United States Patent [19]

Ito et al.

[11] Patent Number: 5,550,501
[45] Date of Patent: Aug. 27, 1996

[54] CURRENT BUFFER CIRCUIT WITH ENHANCED RESPONSE SPEED TO INPUT SIGNAL

[75] Inventors: Masahiro Ito; Yoji Hirano, both of Tokyo, Japan

[73] Assignee: NEC Corporation, Tokyo, Japan

[21] Appl. No.: 392,257

[22] Filed: Feb. 22, 1995

[30] Foreign Application Priority Data

Feb. 23, 1994 [JP] Japan .................................. 6-024590

[51] Int. Cl.⁶ .................................................. H03K 17/04
[52] U.S. Cl. ........................ 327/374; 327/112; 327/379; 327/478
[58] Field of Search ..................................... 327/108, 112, 327/170, 379, 389, 383, 381, 374, 376, 377, 321, 322, 478, 375; 326/87, 85

[56] References Cited

U.S. PATENT DOCUMENTS

| | | | |
|---|---|---|---|
| 4,549,095 | 10/1985 | Stefani et al. | 327/375 |
| 4,553,044 | 11/1985 | Bittner | 327/109 |
| 4,697,103 | 9/1987 | Ferris et al. | 326/89 |
| 4,698,519 | 10/1987 | Cim et al. | 327/375 |
| 4,739,190 | 4/1988 | Alzati et al. | 327/375 |
| 4,880,998 | 11/1989 | Ueda | 326/110 |
| 5,138,195 | 8/1992 | Satou et al. | 326/110 |
| 5,296,765 | 3/1994 | Williams et al. | 327/170 |

FOREIGN PATENT DOCUMENTS 64-72606  3/1989  Japan .

*Primary Examiner*—Timothy P. Callahan
*Assistant Examiner*—My-Trang Nu Ton
*Attorney, Agent, or Firm*—Sughrue, Mion, Zinn, Macpeak & Seas

[57] ABSTRACT

A current buffer circuit comprises an input terminal, an output terminal, a first transistor of a first conductivity type having a base connected to the input terminal and an emitter, and a second transistor of a second conductivity type having a base connected to the input terminal and an emitter. The buffer circuit further includes a third transistor of the second conductivity type having a base connected to the emitter of the first transistor, a collector connected to a first power supply terminal, and an emitter connected to the output terminal, a fourth transistor of the first conductivity type having a base connected to the emitter of the second transistor, a collector connected to a second power supply terminal, and an emitter connected to the output terminal, and a fifth transistor of the second conductivity type having a base connected to the collector of said fourth transistor, a collector connected to said output terminal, and an emitter connected to the second power supply terminal. The fifth transistor becomes conductive when the current flows from the output terminal to the second power supply terminal through the fourth transistor.

8 Claims, 3 Drawing Sheets

20 — INPUT SIGNAL
21 — OUTPUT SIGNAL FROM THE CIRCUIT IN FIG.5
22 — OUTPUT SIGNAL FROM THE CIRCUIT IN FIG.1
23 — OUTPUT SIGNAL FROM THE CIRCUIT IN FIG.2

CURRENT BUFFER CIRCUIT WITH ENHANCED RESPONSE SPEED TO INPUT SIGNAL

BACKGROUND OF THE INVENTION

1. Field of the Invention

The present invention relates to a current buffer circuit and, more particularly, to a current buffer circuit comprising bipolar transistors.

2. Description of the Prior Art

A current buffer circuit is used to drive a heavy load in response to a signal supplied from a circuit having a low driving capability such as an internal circuit. That is, the current buffer circuit is inserted between the internal circuit and the load and responds to the signal from the internal circuit to drive the load with a large current ability and thus a lower impedance. The current buffer circuit is therefore also referred to as an impedance converter circuit.

Since the current buffer circuit is required to have the above mentioned purposes, it is constituted of a so-called push-pull circuit employing a PNP transistor and an NPN transistor each of an emitter-follower type.

Referring to FIG. 5, there is a circuit diagram of a prior art current buffer circuit 50 which is disclosed in Japanese Laid-Open Patent Application No. sho64-72606. This circuit includes an input terminal 11 is connected in common to the bases of a PNP transistor 7 and an NPN transistor 8, a resistor 29 connected between a positive power supply terminal 9 and the emitter of the PNP transistor 7, and a resistor 30 connected between a negative power supply terminal 10 and the emitter of the PNP transistor 8. This circuit 50 further includes an NPN transistor 3, resistors 5 and 6, and an NPN transistor 4 which are connected in series between the positive power supply terminal 9 and the negative power supply terminal 10. The node between the resistors 5 and 6 is connected to an output terminal 12 to which a load indicated by a capacitor 19 to be driven is connected. The NPN transistor 3 and the PNP transistor 4 have their bases connected to the emitter of the PNP transistor 7 and the emitter of the NPN transistor 8, respectively.

The emitter of the PNP transistor 7 has a level higher than that at the input terminal 11 by the forward base-emitter voltage (Vf), while the emitter of the NPN transistor 8 has a level lower than that at the input terminal 11 by Vf. In addition, the emitter of the NPN transistor 3 has a level lower than that at the emitter of the PNP transistor 7 by Vf, while the emitter of the PNP transistor 4 has a level higher than that at the emitter of the NPN transistor 8 by Vf. Therefore, a level equal to that of the input signal input at the input terminal 11 appears at the output terminal 12 as an output signal. The rise in the level of the input signal increases the base voltage of the NPN transistor 3, and decreases that of the PNP transistor 4 so that the level at the output terminal 12 also rises to the high level. On the contrary, a drop in the level at the input terminal increases the base voltage of the PNP transistor 4, and decreases that of the NPN transistor 3 so that the level at the output terminal 12 also drops and changes to the low level.

However, because the PNP transistor 4 has a current gain lower than that of the transistor 3, time required to decrease the voltage level at the output terminal 12 becomes longer than the time required to increase the voltage level at the output terminal 12. As the load 19 becomes heavier, the delay in changing to the low level at the output terminal 12 becomes significant.

SUMMARY OF THE INVENTION

Therefore, an object of the present invention is to provide a current buffer circuit driving a load from the low level to the high level and from the high level to the low level at a high speed.

The current buffer circuit according to the present invention is characterized in that an additional transistor is provided to cooperate a PNP transistor to drive a load.

Specifically, the current buffer circuit according to the present invention comprises a first transistor of the first conductivity type and a second transistor of the second conductivity type, the bases of which are connected to an input terminal, respectively, a first constant current source connected to the emitter of the first transistor, a second constant current source connected to the emitter of the second transistor, a third transistor of the second conductivity type, the base of which is connected to the emitter of the first transistor, the collector of which is connected to a first power supply terminal, and the emitter of which is connected to an output terminal, a fourth transistor of the first conductivity type, the base of which is connected to the emitter of the second transistor, the collector of which is connected to a second power supply terminal, and the emitter of which is connected to the output terminal, and a fifth transistor of the second conductivity type, the base of which is connected to the collector of the fourth transistor, the collector of which is connected to the output terminal, and the emitter of which is connected to the second power supply terminal.

Thus, in the current buffer circuit according to the present invention, when the input signal input to the input terminal goes to a low level, not only the fourth transistor but also the fifth transistor are rendered conductive. Therefore, the output terminal and thus a load is rapidly driven to the low level.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
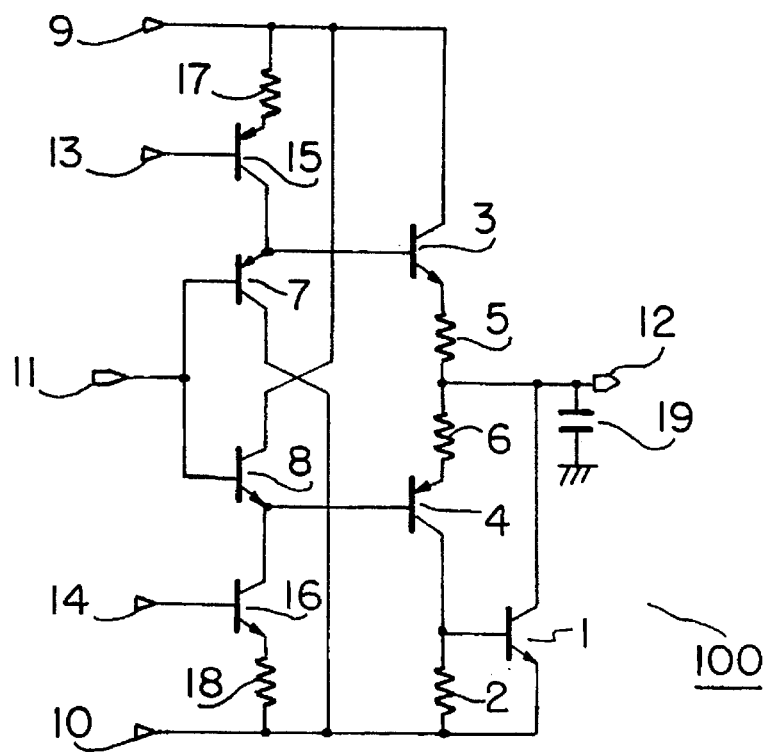
FIG. 1 is the circuit diagram of a current buffer circuit according to one embodiment of the present invention.
Figure 5:
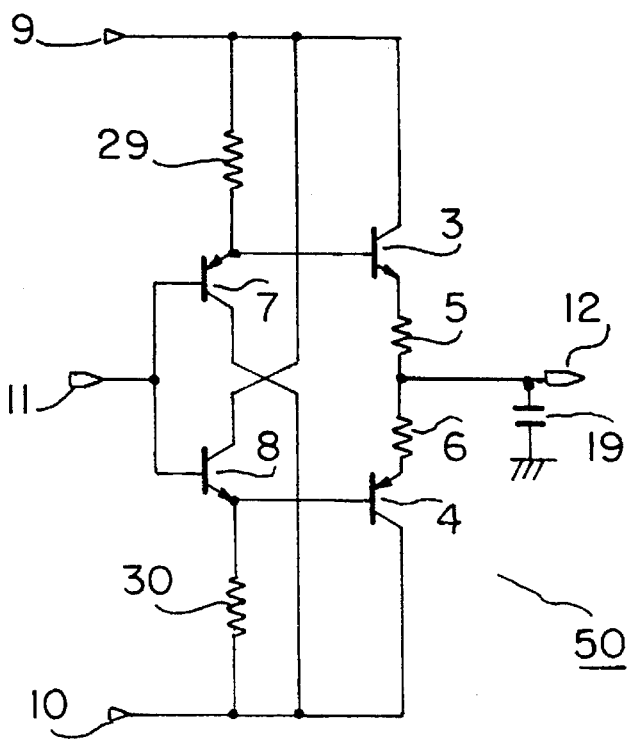
FIG. 5 is the circuit diagram of a conventional current buffer circuit.

Referring now to FIG. 1, there is shown a current buffer circuit according to one embodiment of the present invention, in which the same reference numerals are used for components of the current buffer circuit shown in FIG. 1 similar to those in the current buffer circuit shown in FIG. 5. In this circuit 100, an input terminal 11 is connected to the bases of a PNP transistor 7 and an NPN transistor 8, a resistor 17 and a PNP transistor 15 are connected in series between a positive power supply terminal 9 and the emitter of the PNP transistor 7, and an NPN transistor 16 and a resistor 18 are connected in series between a negative power supply terminal 10 and the emitter of the PNP transistor 8. A first reference or bias voltage is supplied via a terminal 14 to the base of the NPN transistor 15 and via a terminal 14 to the base of the NPN transistor 16. Thus, each of the transistors 15 and 16 operates as a constant current source to produce constant current. Connected in series between the positive power supply terminal 9 and the negative power supply terminal 10 are an NPN transistor 3, resistors 5 and 6, a PNP transistor 4, and a resistor 2. The node point between the resistors 5 and 6 is connected to an output terminal 12 to which a load indicated by a capacitance 19 to be driven is connected. The NPN transistor 3 and the PNP transistor 4 are output transistors of an emitter-follower type and have their bases connected to the emitter of the PNP transistor 7 and the emitter of the NPN transistor 8, respectively. In addition, an NPN transistor 1 is connected across the output terminal 12 and the negative power supply terminal 10. The base of the NPN transistor 1 is connected across the collector of the PNP transistor 4 and the resistor 2. The resistors 5 and 6 are provided for preventing the so-called ringing phenomenon.

With the above arrangement, the base of the NPN transistor 3 is supplied with a voltage higher than the level of the input signal supplied to the input terminal 11 by the forward base-emitter voltage (Vf), and the base of the PNP transistor 4 is supplied with a voltage lower than the level of the input signal by Vf so that the NPN transistor 3 and the PNP transistor 4 perform a class AB operation.

The operation of the current buffer circuit shown in FIG. 1 will be next explained. First, when the input signal supplied to the input terminal 11 takes a center level between the high and low levels, the level at the output terminal 12 is equal to the level of the input signal and, therefore, the base-emitter voltage ($V_{BE}$) of the NPN transistor 3 and the PNP transistor 4 is equal to each other. In this case, although a voltage drop occurs across the resistor 2 and then supplied between the base and emitter of the NPN transistor 1, the resistance value of the resistor 2 is set such that the NPN transistor 1 is not turned on by that voltage, so that the NPN transistor 1 remains off. Then, when the level of the input signal supplied to the input terminal 11 changes toward the high level, the base voltage of the NPN transistor 3 increases, whereas that of the PNP transistor 4 decreases. This increases the current flowing through the NPN transistor 3 and decreases the current flowing through the PNP transistor 4. The transistor 3 has a large current gain. Accordingly, the level at the output terminal 12 moves to the high level at a high speed.

When the input signal level at the input terminal 11, is changed from the high level to the low level, the base voltage of the NPN transistor 3 decreases, whereas that of the PNP transistor 4 increases. This decreases the current flowing through the NPN transistor 3, and increases the current flowing through the PNP transistor 4. An increase in the current flowing through the PNP transistor 4 makes the voltage across the resistor 2 large, so that the NPN transistor 1 is rendered conductive. Thus, the output terminal 12 is driven not only by the PNP transistor 4 but also by the NPN transistor 1. That is, the load 19 is discharged by both of the transistors 1 and 4. When the load 19 is discharged up to the low level of the input signal at the input terminal 11, the current flowing through the transistor 4 is decreased to thereby make the voltage drop across the resistor 2 small. The transistor 1 is thereby turned off again. The low level of the output terminal 12 is substantially equal to the low level of the input terminal 11. Thus, the transistor 1 is rendered conductive only during a transition period of a change in input signal from the high level to the low level.

As described, according to the current buffer circuit 100, the transistor 1 drives the output terminal 12 together with the transistor 4 when the level of the input signal supplied to the input terminal 11 moves to the low level. Therefore, the delay in moving to the low level at the output terminal 12 is lowered considerably, as compare with the absence of the transistor 1.

In addition, the constant current source circuit is formed by the PNP transistor 15 and the NPN transistor 16 to both of which the reference voltage is input. Therefore, because the value of the current flowing through the constant current source does not depend on the level of the input signal, the level of output signal output from the output terminal 12 becomes very accurate in relation to the input signal.

Figure 3:
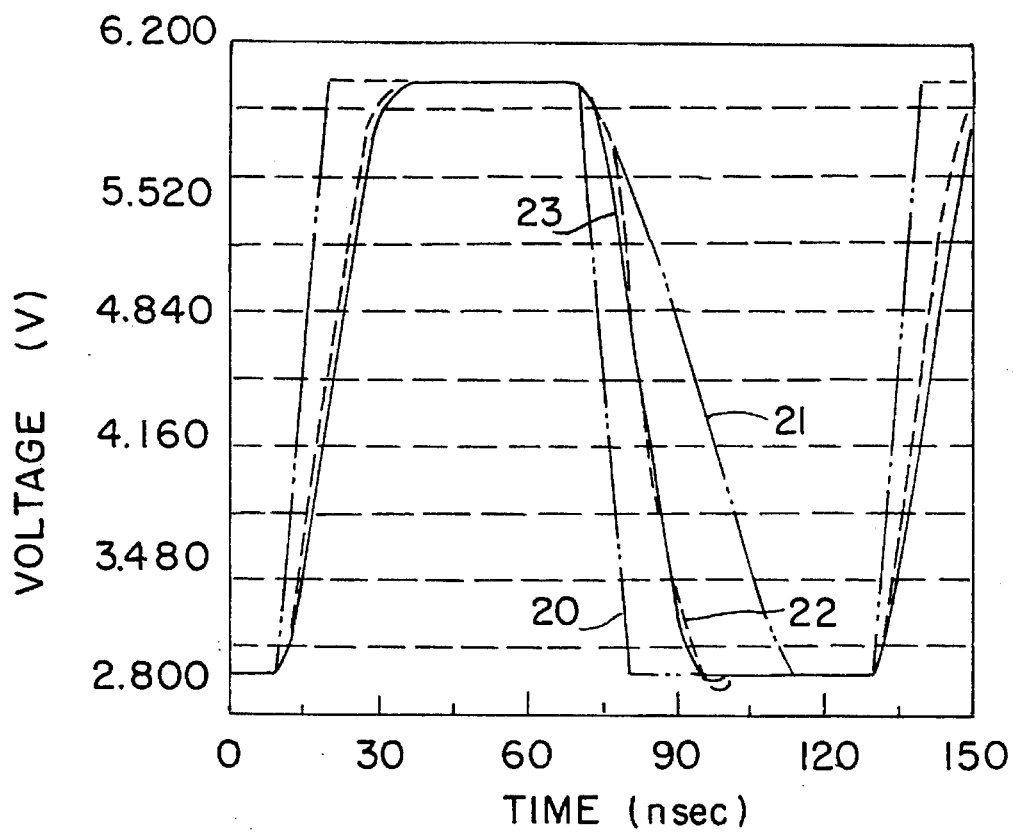
FIG. 3 is a waveform diagram showing waveforms of output signals to input signals of the current buffer circuits shown in FIGS. 2, 3, and 5.

Here, when it is assumed that the voltage at the positive power supply terminal 9 is 10 V, the voltage at the negative power supply terminal 10 is 0 V, the capacitance value of the load capacity is 20 pF, the period of time when the input signal changes from the low level to the high level and when it changes from the high level to the low level is 10 ns, the amplitude of the input signal input to the input terminal 11 is 3–6 V, and the pulse width of the input signal is 50 ns, changes in output signals occurring at the output terminal 12 will be explained with reference to FIG. 3.

FIG. 3 shows changes in the levels of the input and output signals in the current buffer circuits shown in FIGS. 1 and 5. As seen from FIG. 3, when the input signal changes from the low level to the high level, changes in the output signals are substantially the same for either circuits. However, when the input signal changes from the high level to the low level, the output signals change in a manner significantly different for the current buffer circuit shown FIG. 1 and that shown in FIG. 5. That is, if the fall time is taken as the duration from the time when the input signal 20 starts to change from the high level to the low level to the time when the output signal stabilizes at the low level, then the fall time for the output signal 22 of the current buffer circuit shown in FIG. 1 is faster than that for the output signal 21 of the current buffer circuit shown in FIG. 5 by about 27%.

Figure 2:
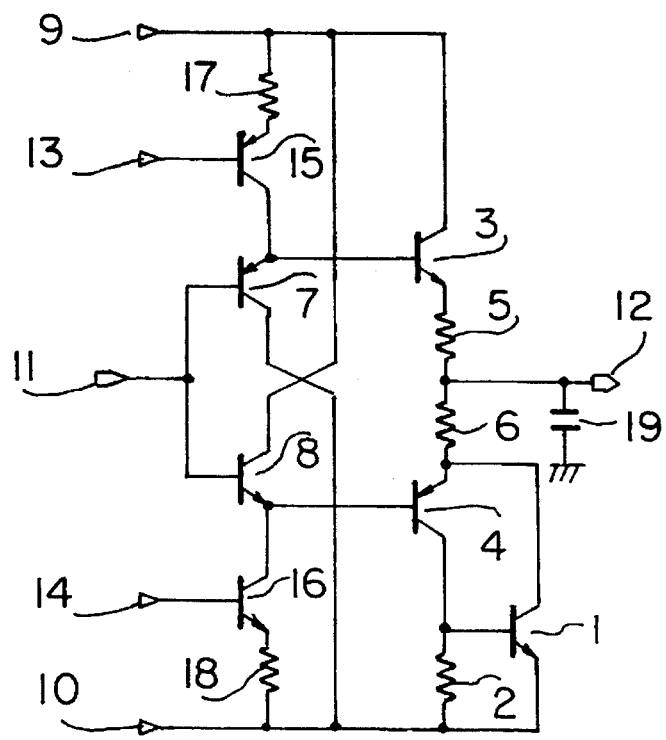
FIG. 2 is the circuit diagram of a current buffer circuit according to another embodiment of the present invention.

In addition, as shown in FIG. 2, the collector of the NPN transistor 1 may be connected to the emitter of the PNP transistor 4. The characteristics of the current buffer circuit shown in FIG. 2 are shown in FIG. 3. As seen from FIG. 3, the output signal 23 of the current buffer circuit shown in FIG. 2 has a fall time substantially no difference from that for the output signal 22, but stabilizes at the low level in a shorter time. That is, the fall time for the output signal 23 of the current buffer circuit shown in FIG. 2 is faster by about 38% than that for the output signal 21 of the current buffer circuit shown in FIG. 5.

Figure 4:
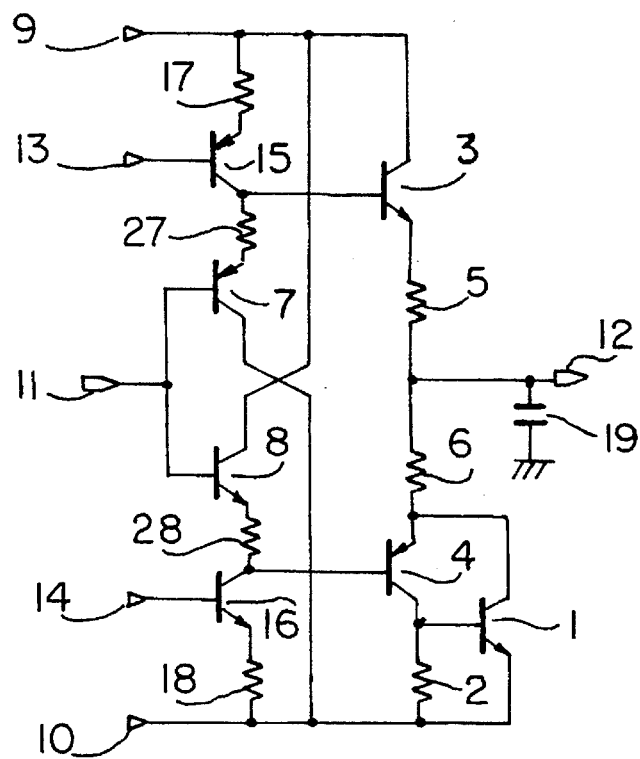
FIG. 4 is the circuit diagram of a current buffer circuit according to still another embodiment of the present invention.

Furthermore, as shown in FIG. 4, it may be possible to insert a resistor 27 between the node of the collector of the PNP transistor 15 and the base of NPN transistor 3, and the emitter of the PNP transistor 7, and to insert a resistor 28 between the node of the collector of the NPN transistor 16 and the base of the PNP transistor 4, and the emitter of the NPN transistor 8. In the current buffer circuit shown in FIG.

4, the resistor 27 increases the base voltage of the NPN transistor 3 to a level higher than the level of the input signal added with the forward base-emitter voltage (Vf), and the resistor 28 decreases the base voltage of the PNP transistor 4 to a level lower than Vf subtracted from the level of the input signal. This increases the base-emitter voltage ($V_{BE}$) Of the NPN transistor 3 and the PNP transistor 4 so that the crossover distortion is further reduced.

It is apparent that the present invention is not limited to the above embodiment but may be modified and changed without departing from the scope and spirit of the invention.

What is claimed is:

1. A current buffer circuit comprising:

an input terminal;

an output terminal;

a first transistor of a first conductivity type having a base coupled to said input terminal, a collector coupled to a first power supply terminal, and an emitter;

a second transistor of a second conductivity, type having a base coupled to said input terminal a collector coupled to a second power supply terminal, and an emitter;

a third transistor of said second conductivity type having a base coupled to the emitter of said first transistor, an emitter coupled to said output terminal, and a collector coupled to said second power supply terminal;

a fourth transistor of said first conductivity type having a base coupled to the emitter of said second transistor, a collector coupled to said first power supply terminal, and an emitter coupled to said output terminal;

a fifth transistor of said second conductivity type having a base coupled to the collector of said fourth transistor, a collector coupled to said output terminal, and an emitter coupled to said first power supply terminal; and a resistor connected between said first power supply terminal and a node of the collector of said fourth transistor and the base of said fifth transistor, a resistance value of said resistor being set such that said fifth transistor is rendered conductive only during a transition period of a change in an input signal at said input terminal from a high level to a low level.

2. The current buffer circuit claimed in claim 1, wherein said first conductivity type is the PNP type, and the second conductivity type is the NPN type.

3. A current buffer circuit comprising:

an input terminal;

an output terminal;

a first transistor of a first conductivity type having a base coupled to said input terminal, a collector coupled to a first power supply terminal, and an emitter;

a second transistor of a second conductivity type having a base coupled to said input terminal, a collector coupled to a second power supply terminal, and an emitter;

a third transistor of said first conductivity type having a base supplied with a first reference voltage, a collector coupled to the emitter of said first transistor, and an emitter;

a fourth transistor of said second conductivity type having a base supplied with a second reference voltage, a collector coupled to the emitter of said second transistor, and an emitter;

a first resistor having one end coupled to the emitter of said third transistor and another end coupled to said second power supply terminal;

a second resistor having one end coupled to the emitter of said fourth transistor and another end coupled to said first power supply terminal;

a fifth transistor of said second conductivity type having a base coupled to the emitter of said first transistor, a collector coupled to said second power supply terminal and an emitter coupled to said output terminal;

a sixth transistor of said first conductivity type having a base coupled to the emitter of said second transistor, an emitter coupled to said output terminal, and a collector;

a seventh transistor of said second conductivity type having a base coupled to the collector of said sixth transistor, a collector coupled to said output terminal and an emitter coupled to said first power supply terminal; and a third resistor having a one end coupled to a node of the collector of said sixth transistor and the base of said seventh transistor, and having another end coupled to said first power supply terminal, a resistance value of said third resistor being established so that a voltage between said first power supply terminal and the base of said seventh transistor exceeds a threshold voltage of said seventh transistor when a current flows from said output terminal to said first power supply terminal through said sixth transistor.

4. The current buffer circuit claimed in claim 3, further comprising a fourth resistor inserted in series between said output terminal and the emitter of said fifth transistor, and a fifth resistor coupled in series between said output terminal and the emitter of said sixth transistor.

5. The current buffer circuit claimed in claim 4, wherein the collector of said fifth transistor is coupled to said output terminal through said fifth resistor.

6. The current buffer circuit claimed in claim 5, further comprising a sixth resistor coupled in series between the collector of said third transistor and the emitter of said first transistor, and a seventh resistor coupled in series between the collector of said fourth transistor and the emitter of said second transistor.

7. The current buffer circuit claimed in claim 3, wherein said first conductivity type is the PNP type, and the second conductivity type is the NPN type.

8. A current buffer circuit comprising:

an input terminal;

an output terminal is coupled to a capacitor load;

a first PNP transistor having a base coupled to said input terminal, a collector coupled to a low level power supply terminal, and an emitter;

a first NPN transistor having a base coupled to said input terminal, a collector coupled to a high level power supply terminal, and an emitter;

a first constant current source coupled between said high level power supply terminal and said emitter of said first PNP transistor;

a second constant current source coupled between said low level power supply terminal and said emitter of said first NPN transistor;

a second NPN transistor having a base coupled to the emitter of said first PNP transistor, a collector coupled to said high level power supply terminal, and an emitter;

a second PNP transistor having a base coupled to the emitter of said first NPN transistor, a collector, and an emitter;

a first resistor having a one end coupled to the emitter of said second NPN transistor and another end coupled to said output terminal;

a second resistor having one end coupled to the emitter of said second PNP transistor and another end coupled to said output terminal;

a third resistor having one end coupled to the collector of said second PNP transistor and another end coupled to said low level power supply terminal; and a third NPN transistor having a base coupled to the collector of said second PNP transistor, a collector coupled to said output terminal, and an emitter coupled to said low level power supply terminal, a resistance value of said third resistor being set such that said third NPN transistor is turned on only during a transition period of a change in input signal at said input terminal from a high level to a low level, and thereby discharging the capacitor load to said low level power supply terminal through both of said second PNP transistor and said third NPN transistor.

* * * * *